(12) United States Patent
Verhulst (10) Patent No.: US 8,304,843 B2
(45) Date of Patent: Nov. 6, 2012

(54) TUNNEL FIELD EFFECT TRANSISTOR WITH IMPROVED SUBTHRESHOLD SWING

(75) Inventor: Anne S. Verhulst, Houtvenne (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/877,909

(22) Filed: Sep. 8, 2010

(65) Prior Publication Data

US 2011/0079860 A1 Apr. 7, 2011

Related U.S. Application Data

(60) Provisional application No. 61/249,186, filed on Oct. 6, 2009.

(51) Int. Cl.
*H01L 27/772* (2006.01)
*H01L 21/336* (2006.01)

(52) U.S. Cl. . 257/402; 257/386; 257/410; 257/E21.409; 257/E29.242; 438/285

(58) Field of Classification Search ............... 257/105, 257/386–410, E21.409, E29.242; 438/285, 438/299, 287, 268
See application file for complete search history.

(56) References Cited

U.S. PATENT DOCUMENTS

| | | | | |
|---|---|---|---|---|
| 5,550,397 A | * | 8/1996 | Lifshitz et al. | 257/412 |
| 6,127,235 A | | 10/2000 | Gardner et al. | |
| 2007/0145474 A1 | | 6/2007 | Annese et al. | |
| 2007/0228491 A1 | | 10/2007 | Forbes | |
| 2008/0067607 A1 | * | 3/2008 | Verhulst et al. | 257/371 |
| 2009/0072270 A1 | | 3/2009 | Asbeck et al. | |
| 2009/0108347 A1 | | 4/2009 | Adkisson et al. | |

OTHER PUBLICATIONS

Björk et al., "Silicon nanowire tunneling field-effect transistors", Applied Physics Letters, 92, 193504 (2008).
Boucart et al., "Double Gate Tunnel FET with High-K Gate Dielectric", IEEE Transactions on Electron Devices, vol. 54, No. 7, Jul. 2007, 1725-1733.
Boucart et al., "Length scaling of the Double Gate Tunnel FET with a high-K gate dielectric", Solid-State Electronics 51 (2007) 1500-1507.
Choi et al., "Tunneling Field-Effect Transistors (TFETs) With Subthreshold Swing (SS) Less Than 60 mV/dec", IEEE Transactions on Electron Devices, vol. 28, No. 8, Aug. 2007, 743-745.

(Continued)

*Primary Examiner* — Cuong Q Nguyen
*Assistant Examiner* — Cathy N Lam
(74) *Attorney, Agent, or Firm* — Knobbe Martens Olson & Bear, LLP (57) ABSTRACT

The present disclosure provides a tunnel field effect transistor (TFET) device comprising at least following segments: a highly doped drain region, a lowly doped up to undoped channel region being in contact with the drain region, the channel region having a longitudinal direction, a highly doped source region in contact with the channel region, the contact between the source region and the channel region forming a source-channel interface, a gate dielectric and a gate electrode covering along the longitudinal direction at least part of the source and channel regions, the gate electrode being situated onto the gate dielectric, not extending beyond the gate dielectric, wherein the effective gate dielectric thickness $t_{gd,eff}$ of the gate dielectric is smaller at the source-channel interface than above the channel at a distance from the source-channel interface, the increase in effective gate dielectric thickness $t_{gd,eff}$ being obtained by means of at least changing the physical thickness $t_{gd}$ of the gate dielectric.

14 Claims, 7 Drawing Sheets

OTHER PUBLICATIONS

Vadizadeh et al., "Using Low-k Oxide for REduction of Leakage Current in Double Gate Tunnel FET", IEEE Explore, Jan. 30, 2009, 301-304.

Verhulst et al., "Boosting the on-current of a n-channel nanowire tunnel field-effect transistor by source material optimization", J. Appl. Phys. 104, 064514 (2008).

Zhang et al., "Low-Subthreshold-Swing Tunnel Transistors", IEEE Transactions on Electron Devices, vol. 27, No. 4, Apr. 2006, 297-300.

* cited by examiner

TUNNEL FIELD EFFECT TRANSISTOR WITH IMPROVED SUBTHRESHOLD SWING

CROSS-REFERENCE TO RELATED APPLICATIONS

This application claims the benefit under 35 U.S.C. §119 (e) of U.S. Provisional Application No. 61/249,186, filed Oct. 6, 2009, the disclosure of which is hereby expressly incorporated by reference in its entirety and is hereby expressly made a portion of this application.

FIELD OF THE INVENTION

The present disclosure is related to the field of semiconductor devices and nanotechnology. More specifically, the disclosure is related to a nanostructure semiconductor device, more specifically to a tunnel field effect transistor (TFET) having improved device properties such as improved sub-threshold-swing values.

BACKGROUND OF THE INVENTION

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short-channel effects) and because it becomes difficult to decrease the supply voltage. The latter is mainly due to the fact that the subthreshold swing is limited to minimally about 60 mV/decade, such that switching the transistor from ON to OFF needs a certain voltage variation and therefore a minimum supply voltage.

A potential candidate to replace the MOSFET in future technology nodes is a Tunnel Field Effect Transistor (TFET) because a TFET does not have a limit to its subthreshold swing, and therefore it holds the promise to operate at a supply voltage well below 1 V. However, not all TFETs beat the 60 mV/dec limit. The smaller the bandgap of especially the TFET source material and the thinner the gate dielectric, the more likely the device will beat the 60 mV/dec limit [A. S. Verhulst et al., "Boosting the on-current of a n-channel nanowire tunnel field-effect transistor by source material optimization", J. Appl. Phys. 104, 064514 (2008)]. An all-silicon TFET e.g. has an average subthreshold swing of about 200 mV/dec.

Suggestions have been made in literature to improve the subthreshold swing of the TFET such as changing the material of the TFET to a smaller bandgap material, however this is a technological challenge because it is necessary to further develop the technology, find compatibility with the widely-used Si technology and find a good gate-dielectric material if this material forms part of the channel.

Another solution suggested in literature is a further decrease in gate-dielectric thickness which is also a technological challenge which probably requires exploring further higher-k gate dielectric materials in order to ensure that the gate leakage currents remain low.

As a conclusion there still exists a problem to improve the subthreshold swing of a TFET without having to change the TFET material and without having to further decrease the gate-dielectric thickness.

SUMMARY OF THE INVENTION

It is an object of embodiments of the present disclosure to provide a method for achieving a tunnel Field Effect transistor (TFET) wherein the subthreshold swing of the TFET is improved such that the supply voltage may be further reduced, without having to change the TFET material and without having to further decrease the gate-dielectric thickness.

According to embodiments of the disclosure, a Tunnel Field Effect transistor (TFET) is disclosed thereby improving the subthreshold swing of the TFET without having to change the TFET material and without having to further decrease the gate-dielectric thickness.

The present disclosure solves the problem of too high subthreshold values in a TFET by fabricating a TFET with a varying effective gate-dielectric thickness $t_{gd,eff}$ along the channel whereby $t_{gd,eff}$ is defined in formula [1]:

$$t_{gd,eff} = t_{gd} \frac{\varepsilon_{silicon\,dioxide}}{\varepsilon_{gd}} \quad [1]$$

(with $\varepsilon_{gd}$ the dielectric constant of the gate dielectric). In particular the effective gate-dielectric thickness is small at the source-channel interface and is increasing as the distance to the source-channel interface increases.

According to embodiments of the present disclosure, the increase of the effective gate-dielectric thickness $t_{gd,eff}$ along the channel can be abrupt, gradual or a combination of both abrupt and gradual.

In a first aspect, the present disclosure provides a tunnel field effect transistor (TFET) device, the TFET comprising at least following segments (regions):
A highly doped drain region, made of a drain semiconductor material,
A lowly doped up to undoped channel region made of a channel semiconductor material and being in contact with the drain region, the channel region having a longitudinal direction,
A highly doped source region made of a source semiconductor material in contact with the channel region, the contact between the source region and the channel region forming a source-channel interface,
A gate dielectric and a gate electrode covering along the longitudinal direction at least part of the source and channel regions, the gate electrode being situated onto the gate dielectric, not extending beyond the gate dielectric,
wherein the effective gate dielectric thickness $t_{gd,eff}$ is smaller at the source-channel interface than above the channel at a distance from the source-channel interface, the increase in effective gate dielectric thickness $t_{gd,eff}$ being obtained by means of at least changing the physical thickness $t_{gd}$ of the gate dielectric.

According to embodiments the increase in effective gate-dielectric thickness $t_{gd,eff}$ along the channel is achieved at least as a result of a physical change in the gate dielectric thickness. The physical gate dielectric thickness may increase as the distance to the source-channel interface increases, in an abrupt a gradual or a combined abrupt and gradual way. On top thereof, the increase in effective gate-dielectric thickness may be achieved as a result of a change in dielectric constant of the gate dielectric $\in_{gd}$ e.g. a change from hafnium oxide to silicon dioxide in combination with an altering thickness $t_{gd}$ of the gate dielectric. Hence, the increase in effective gate-dielectric thickness $t_{gd,eff}$ along the channel may be achieved as a result of a change in dielectric constant of the gate dielectric $\in_{gd}$ whereby two gate dielectric materials are provided with a different dielectric constant $\in_{gd}$ and wherein at least one of gate dielectric materials has a an altering thickness along the channel.

According to embodiments the increase in effective gate-dielectric thickness $t_{gd,eff}$ along the channel is achieved in combination with a variation in physical channel thickness or without affecting the channel thickness.

According to embodiments the increase in effective gate-dielectric thickness $t_{gd,eff}$ along the channel is achieved by decreasing the gate-dielectric thickness while decreasing the gate-dielectric constant such that the effective gate-dielectric thickness $t_{gd,eff}$ increases.

According to embodiments the increase in effective gate-dielectric thickness $t_{gd,eff}$ along the channel may be achieved by increasing the gate-dielectric thickness while increasing the gate-dielectric constant, such that the effective gate-dielectric thickness $t_{gd,eff}$ increases.

According to embodiments the increase in effective gate-dielectric thickness $t_{gd,eff}$ along the channel may be achieved by having a gate dielectric having a first section with a first length with constant first thickness and a second section with second length with varying and increasing thickness or having a second section with second length and a constant second thickness being greater than the first thickness. The first length of the first section with constant thickness is for example from 0 nm beyond source-channel interface (=section extending only in the source region, and whereby a variation occurs immediately beyond the source-channel interface) up to 50 nm, for example up to 30 nm, e.g. up to 20 nm beyond the source-channel interface, for example the first length of the first section with constant thickness is from 0 nm beyond source-channel interface up to 10 nm beyond source-channel interface. The second section with thickness increase (if present) is for example having thickness changes from 0.05 nm up to 50 nm, for example the thickness increase is from 0.1 nm up to 10 nm.

According to embodiments the increase in effective gate-dielectric thickness $t_{gd,eff}$ along the channel is achieved, on top of a physical change in thickness, by having a gate dielectric having a dielectric constant decrease. The dielectric constant decrease may be up to the lowest possible value according to state-of-the-art dielectric materials (being about k=2.4-2.5, while the theoretical limit is an air gap with relative dielectric constant of 1).

According to yet another embodiment the increase in effective gate-dielectric thickness $t_{gd,eff}$ along the channel is achieved as the result of two gate dielectric layers (made of two different gate dielectric materials) on top of each other, whereby only 1 layer covers at least part of the channel up to and possibly beyond the source-channel interface up to the source, while the other layer only covers a limited part of the channel thereby avoiding that the second dielectric layer covers the source-channel interface. This may be realized by first depositing a first gate dielectric layer covering a substantial length of the channel (including the source-channel interface) followed by a partial deposition of a second gate dielectric layer onto the first dielectric layer whereby the length of the second dielectric layer is not covering as much of the substantial length of the channel, thereby avoiding coverage of the source-channel interface. Alternatively this may be realized by first etching away part of the channel, leaving the source-channel interface intact, followed by depositing a first dielectric layer into the removed area and a Chemical Mechanical Planarization (CMP) step to planarize the first dielectric layer and to avoid coverage of the source-channel interface, followed by deposition of a second dielectric layer covering the at least the part of the channel covered by the first dielectric layer and the source-channel interface.

According to embodiments, the TFET may be a planar or a vertical device configuration. In case the TFET is a vertical TFET device it may for example be made of a nanostructure comprising different segments (e.g. a segmented nanowire) wherein the segments form the source, channel and drain region of the TFET.

According to embodiments of the disclosure, the TFET may be a segmented hetero-TFET, for example it may be a vertical nanostructure e.g. a nanowire wherein the different segments represent the source, channel and drain regions of the TFET. The disclosure is however not limited to vertical TFET structures but is also applicable to planar TFET structures, FINFET structures, or the like.

According to embodiments, the TFET device may be made of a nanostructure e.g. a nanowire wherein the nanostructure forms the channel and potentially also the source and drain regions of the TFET. Alternatively, either the source or drain regions of the TFET are situated in the substrate whereby the substrate comprises highly doped regions acting as source and drain regions.

According to embodiments, the TFET device may be made of a nanostructure and the nanostructure for example has a diameter between 1 and 500 nm and a length between 5 nm and 50 µm, for example a diameter between 2 nm and 200 nm and a length between 10 nm and 5 µm.

According to embodiments, the length of the channel region (referred to as $L_{channel}$) may be in the range of 5 nm to 2 µm, for example in the range of 10 nm to 1 µm.

According to embodiments of the disclosure, the source and drain regions in the TFET of the present disclosure (e.g. in a segmented hetero-TFET) are selectively doped to a desired doping level with a desired dopant type, for example the source and drain regions may be selectively doped to a dopant concentration of $10^{18}$/cc to $10^{21}$/cc to form a highly doped source and drain region.

According to embodiments of the disclosure, the semiconductor materials used to provide the source, channel and drain regions of the TFET (hetero-TFET) may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Alternatively the semiconductor material is selected from semiconducting Carbon NanoTubes (CNT).

According to embodiments of the disclosure, the source, channel and drain semiconductor material of the TFET is made of silicon.

According to embodiments, the gate dielectric is selected from silicon based oxide (e.g. silicon dioxide, silicon oxy nitride) having a relative dielectric constant of 3.9, or selected from state-of-the-art high-k dielectric materials and/or low-k dielectric materials (low-k materials typically having a relative dielectric constant of around 2.4-2.5).

According to embodiments, the gate electrode (contact) is made of a conductive material. The conductive material may for example be selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular, the gate contact may be made of a metal of which the workfunction has been engineered specifically for the chosen nanostructure material.

According to embodiments, the TFET is further comprising source and drain contacts. For example the contacts may be made from a conductive material which is selected from at least one of a silicide containing structure (NiSi, $CoSi_2$, $TiSi_2$, or the like), a germanide containing structure, a metal containing structure, poly silicon or a combination thereof. In particular embodiments, the source and drain contacts may be made from a combination of a metal with a silicide.

In another aspect, particular embodiments of the present disclosure disclose a method for providing a tunnel field effect transistor (TFET) with improved subthreshold-swing value, the method comprising at least the steps of:

Providing a substrate,

Providing a highly doped drain region in contact with the substrate, the drain region made of a drain semiconductor material, Providing a lowly doped or undoped (intrinsic) channel region made of a channel semiconductor material in contact with the drain region, Providing a highly doped source region made of a source semiconductor material in contact with the channel region, a source-channel interface being generated between the source region and the channel region, providing along the channel region a gate dielectric and a gate electrode, the gate dielectric covering along the longitudinal direction at least part of the source and channel regions and the gate electrode being situated onto the gate dielectric, not extending beyond the gate dielectric.

Providing a gate dielectric is such that the effective gate dielectric thickness $t_{gd,eff}$ is smaller at the source-channel interface than at a distance from the source-channel interface, the increase in effective gate dielectric thickness being obtained by means of at least changing the physical thickness of the gate dielectric $t_{gd}$ over the longitudinal direction of the channel.

According to embodiments of the disclosure the source and drain regions are selectively doped to the desired doping level with the desired dopant type, for example $10^{18}$/cc to $10^{21}$/cc to form a highly doped source and drain region, for example the doping level of the source region and drain region may be in the range of $10^{19}$/cc to $5 \times 10^{20}$/cc. The doping may be p-type dopants or alternatively n-type dopants.

According to embodiments of the disclosure the semiconductor materials used to make up the source, channel and drain region are selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Alternatively the semiconductor materials are selected from semiconducting Carbon NanoTubes (CNT).

According to embodiments of the disclosure the source, drain and channel semiconductor material is made of silicon.

In a method according to embodiments of the present disclosure, providing a gate dielectric may comprise removing part of the gate dielectric, for example by etching, so as to obtain a gate dielectric with a first section with a constant first thickness over a first length and a second section with a constant second thickness over a second length, the first thickness being smaller than the second thickness. In alternative embodiments, providing a gate dielectric may comprise removing part of the gate dielectric, for example by etching, so as to obtain a gate dielectric with a first section with a constant first thickness over a first length and a second section with a gradually increasing thickness over a second length, the gradually increasing thickness changing from the first thickness up to a second thickness larger than the first thickness.

In a method according to yet alternative embodiments of the present disclosure, providing a gate dielectric may comprises sloped growing of the gate dielectric.

The method and TFET device configuration according to embodiments of the disclosure have the additional advantage (beneficial side-effect) that unwanted ambipolar behaviour is decreased, because the effective gate-dielectric thickness at the gate-drain interface has increased.

The method and TFET device configuration according to embodiments of the disclosure have a further additional advantage that the parasitic gate-drain capacitance is decreased, because the effective gate-dielectric thickness at the gate-drain interface has increased.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

All figures are intended to illustrate some aspects and particular embodiments of the present disclosure. The figures are depicted in a simplified way for reason of clarity. Not all alternatives and options are shown and therefore the disclosure is not limited to the content of the given drawings. Like numerals are employed to reference like parts in the different figures.

FIG. 2 illustrates TFET structures according to embodiments of the disclosure with a single gate dielectric layer with varying effective gate dielectric thickness.

FIG. 3 illustrates TFET structures according to embodiments of the disclosure with two (or more) gate dielectric layers.

FIG. 4 illustrates device simulations (Medici, Synopsys, version 2008.09).

DETAILED DESCRIPTION OF THE PREFERRED EMBODIMENT

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of particular exemplary embodiments, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is to be understood that some embodiments may be practiced without these specific details. In other instances, well-known methods, structures and techniques have not been shown in detail in order not to obscure an understanding of this description.

The disclosure will now be described by a detailed description of several embodiments. It is clear that other embodiments can be configured according to the knowledge of persons skilled in the art without departing from the technical teaching of the disclosure as defined by the appended claims.

Particular embodiments of the present disclosure comprise a TFET device with a varying effective gate dielectric thickness. The use of a varying effective gate dielectric thickness whereby the source-channel interface is covered with a thinner gate dielectric than parts of the remainder of the channel improves the subthreshold swing, because it delays the onset of tunnelling while providing a similar on-current as the configuration with a constant gate-dielectric thickness, due to the fact that the region of dominant tunnelling moves closer and closer to the source-channel interface as the current increases and this is the region where the gate dielectric is small and constant.

The TFET of embodiments of the present disclosure differs from all state-of-the-art TFET devices in the fact that a gate dielectric is used with a varying thickness optionally in combination with a varying gate-dielectric value or alternatively wherein two gate-dielectric materials of different length are used such that the source-channel interface is covered with less gate dielectric material than parts of the remainder of the channel.

Figure 1:
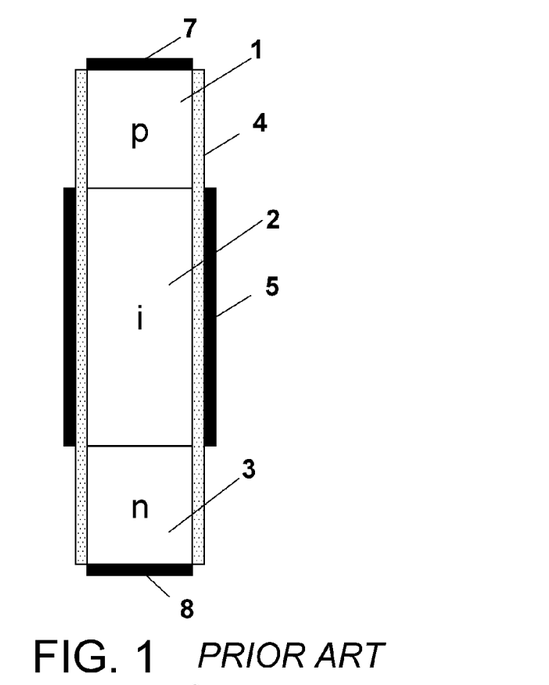
FIG. 1 illustrates a PRIOR ART TFET structure.

FIG. 1 illustrates a cross-section of a state-of-the-art TFET having a gate dielectric 4 with a constant thickness covering at least part of the source 1 region, the whole length of the channel 2 region and at least part of the drain 3 region. Furthermore the state-of-the-art TFET comprises a gate electrode 5 and source and drain contacts 7, 8.

FIGS. 2A-2D illustrate a TFET according to embodiments of the disclosure whereby a gate dielectric layer 10 is present with increasing effective gate dielectric thickness.

Figure 2A:
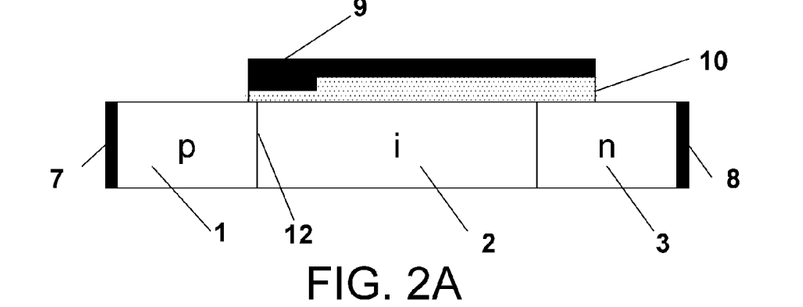
FIG. 2A illustrates a TFET with an abrupt increase in thickness of the gate dielectric and FIG. 2B illustrates a TFET with an abrupt increase in thickness of the gate dielectric which affects the channel thickness.
Figure 2B:
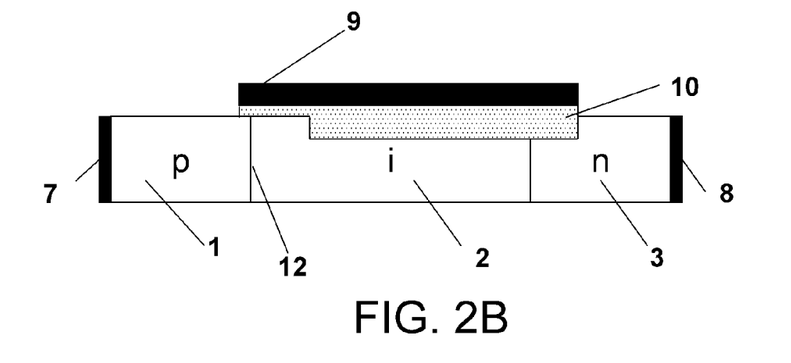
Figure 2C:
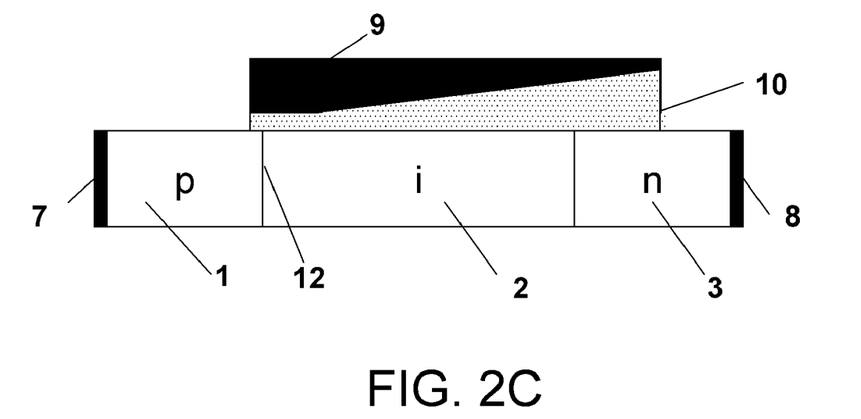
FIG. 2C illustrates a TFET with a gradual increase in gate dielectric thickness and FIG. 2D illustrates a TFET with a gradual increase in gate dielectric thickness which affects the channel thickness.
Figure 2D:
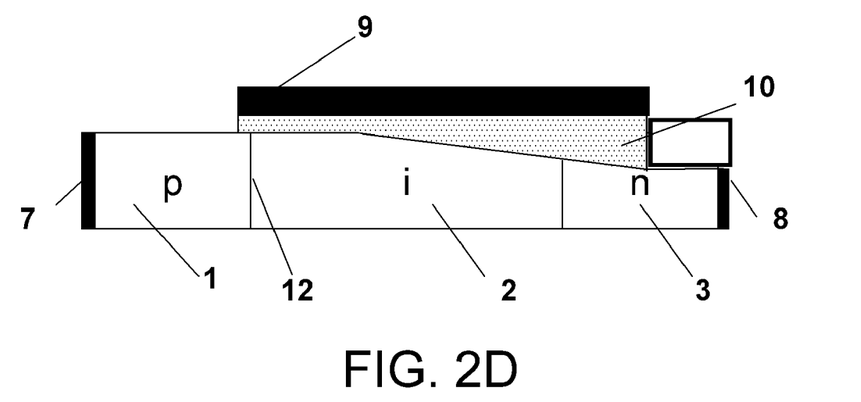

FIG. 2A illustrates a TFET with an abrupt increase in gate dielectric 10 thickness and FIG. 2B illustrates a TFET with an abrupt increase in gate dielectric 10 thickness which affects the channel 2 thickness. FIG. 2C illustrates a TFET with a gradual increase in gate dielectric 10 thickness and FIG. 2D illustrates a TFET with a gradual increase in gate dielectric 10 thickness which affects the channel thickness. Furthermore the TFETs according to embodiments of the present disclosure comprise a gate electrode 9 and source and drain contacts 7, 8. The effective gate dielectric thickness $t_{gd,eff}$ is smaller at the source-channel interface 12 than above the channel 2 at a distance from the source-channel interface (12). The increase in effective gate dielectric thickness is obtained by means of at least changing the physical thickness $t_{gd}$ of the gate dielectric 10.

Figure 3A:
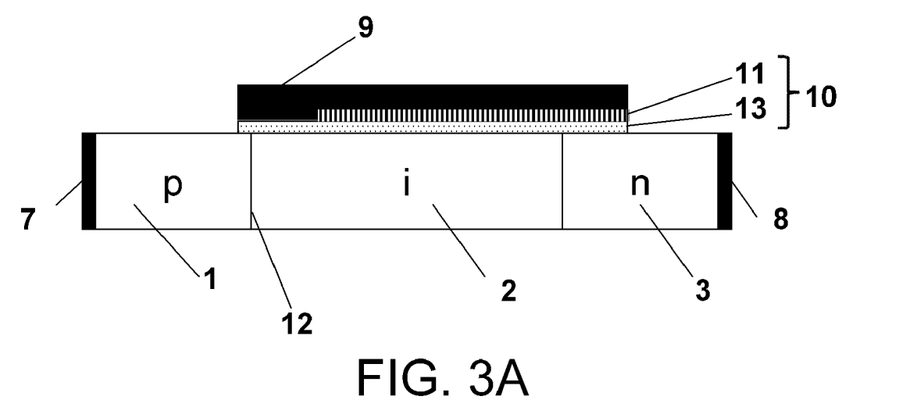
FIG. 3A illustrates a TFET structure in which a first dielectric layer is covering the whole channel length, with a second gate dielectric layer on top of the first gate dielectric layer wherein the length of the second dielectric layer is not covering the whole length of the channel thereby avoiding coverage of the source-channel interface.
Figure 3B:
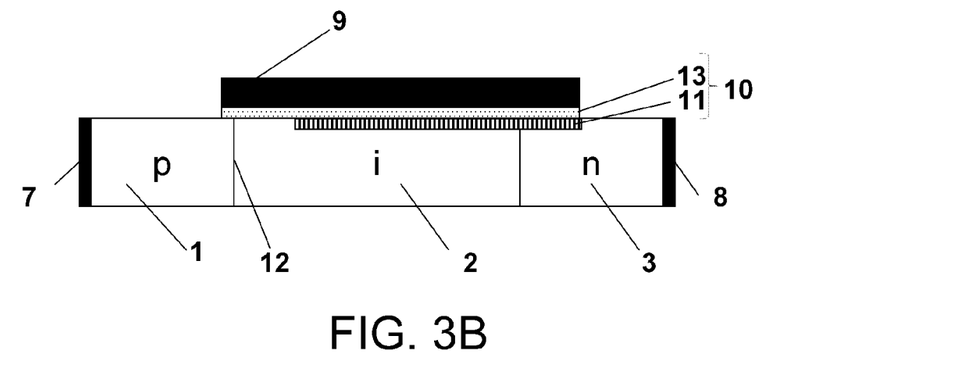
FIG. 3B illustrates a TFET structure in which part of the channel is removed followed by depositing a first dielectric layer into the removed area and a second dielectric layer covering the whole length of the channel.

FIG. 3A illustrates a TFET structure in which a first dielectric layer 13 is covering the whole channel 2 length with a second gate dielectric layer 11 on top of the first gate dielectric layer 13 wherein the second dielectric layer 11 is not covering the whole length of the channel 2 thereby avoiding coverage of the source-channel interface 12. The first dielectric layer 13 and the second dielectric layer 11 together form the gate dielectric layer 10. FIG. 3B illustrates a TFET structure in which part of the channel 2 is removed followed by depositing a second dielectric layer 11 into the removed area and a first dielectric layer 13 on top of the second dielectric layer 11 covering the whole length of the channel 2. Again, the first dielectric layer 13 and the second dielectric layer 11 together form the gate dielectric layer 10.

Figure 8:
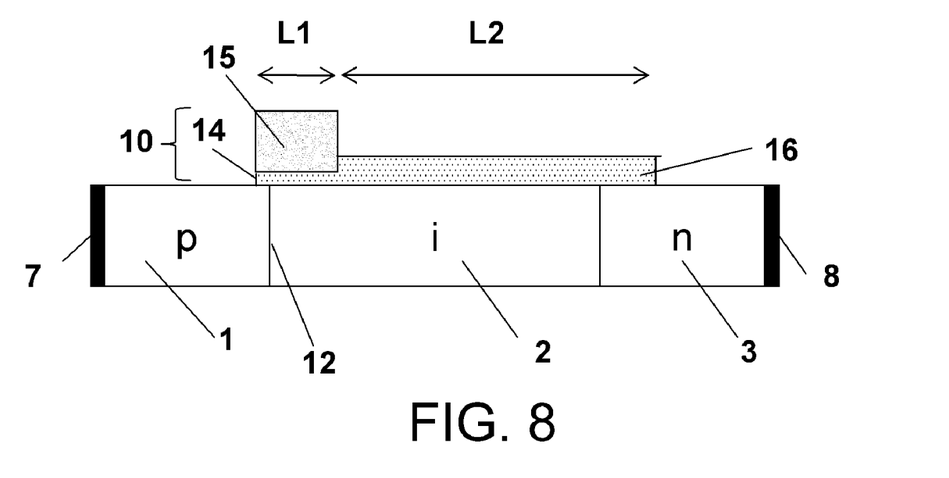
FIG. 8 illustrates a TFET structure according to an alternative embodiment of the present disclosure.

FIG. 8 illustrates an alternative TFET structure according to embodiments of the present disclosure, in which the increase in effective gate-dielectric thickness $t_{gd,eff}$ along the channel 2 is achieved by decreasing the gate-dielectric thickness while decreasing the gate-dielectric constant such that the effective gate-dielectric thickness $t_{gd,eff}$ increases. As an example only, as illustrated in FIG. 8, in a first a section with length L1, a layer 14 of a first semiconductor material with a first k-value and a first thickness, e.g. a 1 nm $SiO_2$ layer, may be provided with on top thereof a layer 15 of a second semiconductor material with a second k-value different from the first k-value and a second thickness, e.g. a 4 nm $HfO_2$ layer. For the example given, the total effective oxide thickness is 1.7 nm (1+4/21*3.9=1.7 nm, with 21 the $HfO_2$ k-value and 3.9 the SiO2 k-value). Then there is a second section with length L2, with a layer 16 of the first semiconductor material having a thickness different from the first thickness, for example a 2 nm $SiO_2$ layer. For the example given, the effective oxide thickness of the second section is 2 nm, which is larger than the effective oxide thickness of the first section, although the second section is physically thinner. For sake of ease, the gate electrode is not illustrated in FIG. 8.

According to particular embodiments the TFET is a vertical or planar TFET device. In case the TFET is a vertical TFET, it may be a nanostructure TFET such as a semiconducting nanowire wherein the diameter of the nanowire is between 1 and 500 nm and the length of the nanowire is between 5 nm and 50 μm. In particular embodiments, the diameter of the nanowire may be between 2 nm and 200 nm and the length of the nanowire may be between 10 nm and 5 μm.

According to particular embodiments of the disclosure, the TFET of the present disclosure may be a segmented hetero-TFET such as a vertical nanostructure e.g. a nanowire wherein the different segments represent the source, channel and drain regions of the TFET.

According to embodiments of the disclosure, the source 1 and drain 3 regions in the TFET device may be selectively doped to a desired doping level with a desired dopant type, for example the source and drain regions may be selectively doped to a dopant concentration of $10^{18}$/cc to $10^{21}$/cc to form a highly doped source and drain region.

According to embodiments of the disclosure, the semiconductor materials used to make up the source, channel and drain regions of the (hetero)-TFET may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. Alternatively the semiconductor materials of the (hetero)-TFET may be semiconducting Carbon nanotubes (CNT).

According to particular embodiments of the disclosure, the channel semiconductor material of the TFET device is made of silicon.

A TFET device according to embodiments of the disclosure, comprises along the source-channel-d rain regions 1, 2, 3 a gate dielectric 10 and a gate electrode 9, the gate dielectric 10 covering along the longitudinal direction thereof at least part of the source-channel-drain regions 1, 2, 3. The gate electrode 9 is situated onto the gate dielectric 10, not extending beyond the gate dielectric 10. The TFET may furthermore comprise at least one source contact 7 on the at least one source region 1.

In the embodiments illustrated, the gate dielectric 10 covers the whole channel region. It is, however, not intended to limit the disclosure to such embodiments. According to particular embodiments of the disclosure, the TFET device comprises along the channel region 2 a gate dielectric 10 and a gate electrode 9, the gate dielectric 10 covering along the longitudinal direction at least part of the source-channel regions 1, 2 and not the drain region 3. Also in these particular embodiments and the gate electrode 9 is situated onto the gate dielectric 10, not extending beyond the gate dielectric 10. The TFET may furthermore comprise at least one source contact 7 on the at least one source region 1. Such obtained TFET device having a gate dielectric covering the source-channel interface and not the channel-drain interface is also referred to as a "short-gate TFET" and is described in EP 1901354 A1, incorporated herein by reference.

Furthermore, embodiments of the present disclosure provide a method to fabricate a Tunnel Field Effect Transistor (TFET) device configuration (e.g. in a segmented nanowire TFET) with improved device characteristics such as improved subthreshold swing leading to a decreased supply voltage (lower power consumption), a decreased (unwanted) ambipolar behaviour and a decreased parasitic gate-drain capacitance.

EXAMPLES

Examples 1 and 2 (illustrated in FIGS. 5-7) describe possible processing methods and flow diagrams for fabricating a TFET (e.g. a NW-TFET) with a varying effective gate-dielectric thickness $t_{gd,eff}$ according to embodiments of the present disclosure. These flowcharts are to be understood as examples of suitable methods for forming a device according to embodiments of the disclosure. The sequence of the process steps as described hereinafter is not intended to be limiting the disclosure in any way. Also the flowcharts refer to the particular embodiment of a nanostructure TFET such as a nanowire TFET wherein a segmented nanowire acts as a p-i-n structure, however, this is not limiting the disclosure and planar TFETs, double-gate TFETs, FinFET TFETs and horizontal nanowire TFETs, not including vertical nanostructures are also covered by embodiments of the present disclosure.

Example 1

Figure 5:
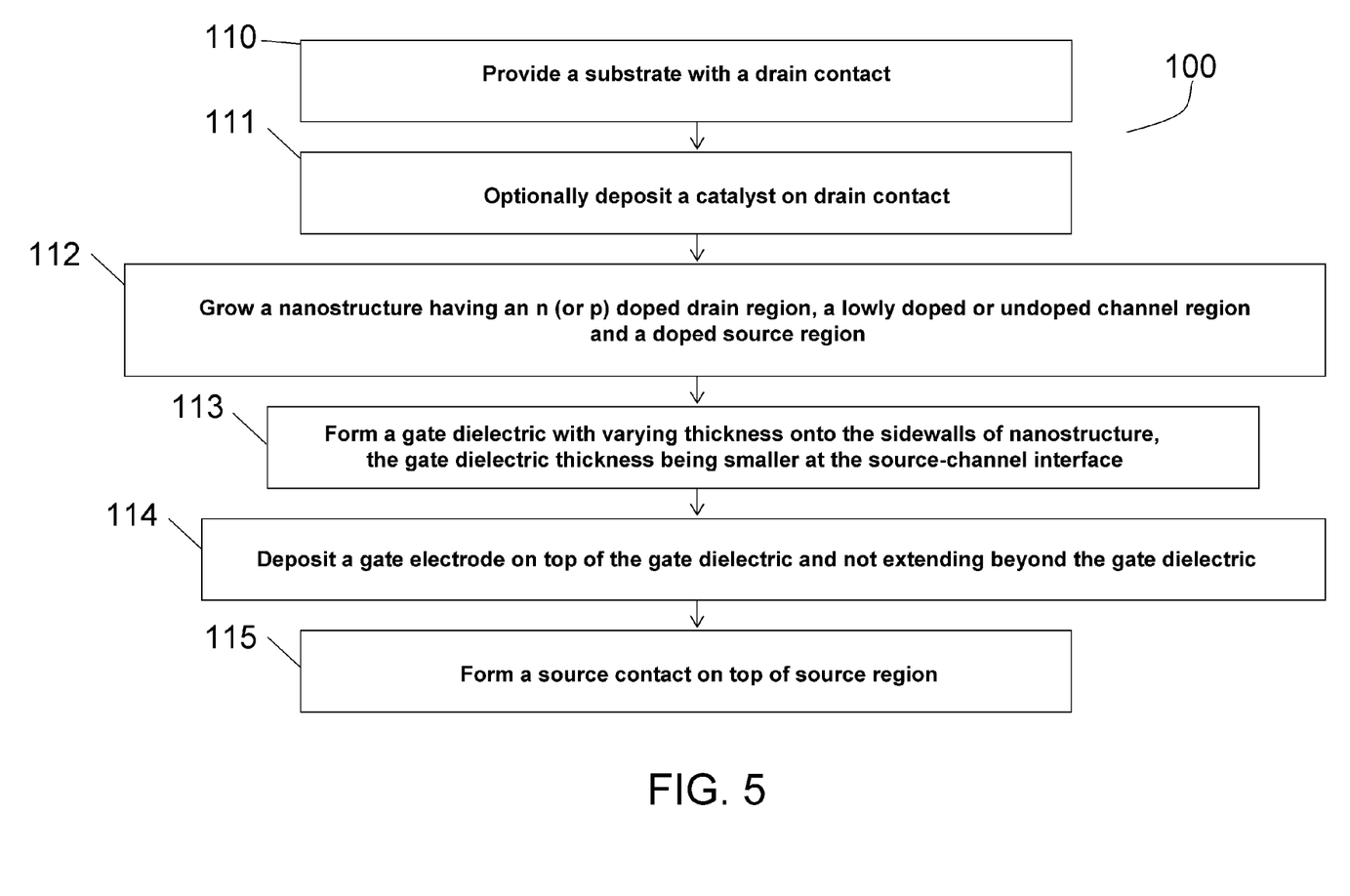
FIG. 5 illustrates an example of a flow diagram for fabricating a TFET (e.g. a NW-TFET) according to embodiments of the present disclosure thereby providing a gate dielectric with varying physical thickness.

A Processing Method 100 and Related Flow Diagram for Fabricating a TFET Having a Gate Dielectric with Varying Physical Thickness As illustrated in FIG. 5 in a first step 110, a substrate is provided. As an example the substrate may be a semiconductor substrate such as a silicon substrate or a silicon on insulator (SOI) substrate but any other suitable substrate can be used as well such as, for example, glass, ceramics, etc. According to an embodiment of the disclosure, in the substrate or alternatively on top of the substrate, a drain contact 8 is created. The drain contact 8, may be made of a conductive material, e.g. the drain contact 8, may be a silicide containing structure (NiSi, $CoSi_2$, $TiSi_2$ ...), a germanide containing structure, a metal containing structure, polysilicon or a combination thereof. Also covered by embodiments of the present disclosure are drain contacts 8, formed of e.g. conductive oxides and even conductive polymers. In case the drain contact 8 is a metal containing structure, all metals which form an ohmic contact with the material of a nanowire, or in other words all metals having a comparable work function with respect to the work function of the material of the nanowire, are metals which may be used according to embodiments of the disclosure. For example the drain contact 8 may be a silicide containing structure. The drain contact 8, can be the starting point for growing the nanowire and can, at the same time, act as the catalyst for the nanowire growth. However, the latter is not necessarily the case.

In case the drain contact 8 cannot be used as a catalyst for the subsequent nanowire growth, a catalyst needs to be deposited onto the drain contact 8, step 111. The requirement of catalyst particles also depends on the technique used to form the nanowire.

According to embodiments and in a next step 112, a nanostructure, e.g. a nanowire, is grown, e.g. by means of a VLS (Vapor-Liquid-Solid) process, but also any other suitable technique known by a person skilled in the art may be used to form the nanostructures, e.g. nanowires according to embodiments of the disclosure. For example, the nanostructure may be grown using techniques such as CVD (Chemical Vapor Deposition), MO-CVD (Metal Organic Chemical Vapor Deposition), or PECVD (plasma enhanced chemical vapor deposition) processes. Alternatively, also PLD (Pulsed Laser Deposition), ECD (Electrochemical Deposition), e-beam or MBE (Molecular Beam Epitaxy) processes may be used to grow the nanowires.

According to embodiments of the present disclosure, during growth of the nanostructure, e.g. nanowire, different regions with different doping levels and different doping types need to be created to form the drain region 3, the channel region 2, and the source region 1 of the nanostructure. The different regions in the nanostructure can be doped during the growth process to obtain an n-type or p-type region. Alternatively, the doping of the nanostructure may be performed after growth of the nanostructure by means of an additional doping step. The doping in one specific region, e.g. source region/drain region may for example be uniform, but these regions may also have a non-uniform doping profile.

According to embodiments of the present disclosure, during growth of the nanostructure, first a drain region 3 may be created. The drain region 3 may be made of a first semiconductor material which is highly doped, e.g. highly n doped in case of a p-type NW-TFET, or alternatively in case of an n-type NW-TFET the drain region 3 is highly p doped. In particular, the doping level of the drain region may be in the range of $10^{18}$/cc to $10^{21}$/cc. As an example, the doping level of the drain region 3 may be in the range of $10^{19}$/cc to $5.10^{20}$/cc.

According to embodiments a channel region 2 of is formed in the nanostructure. The channel region 2 may for example be made of semiconductor material, although other suitable/compatible materials can be used. As an example the channel region may be lowly doped, i.e. lower doped than the source and drain regions, e.g. to a doping level below $10^{15}$/cc or alternatively the channel region may be undoped.

According to embodiments and in a next step, a source region 1 is created. The source region 1 is made of a semiconductor material which is highly doped, e.g. highly n doped in case of an n-type NW-TFET, or alternatively in case of an n-type NW-TFET the source region 1 is highly p doped. In particular, the doping level of the source region 1 may be in the range of $10^{18}$/cc to $10^{21}$/cc, for example the doping level of the drain region may be in the range of $10^{19}$/cc to $5.10^{20}$/cc.

According to embodiments and in next steps 113, 114, a gate structure is formed onto the sidewalls of the nanostructure, more specifically at least onto the sidewalls of the channel region 2 of the nanostructure. The gate structure comprises a gate dielectric 10 (also referred to as gate oxide) and a gate electrode 9 (also referred to as gate contact). First the gate dielectric 10 is formed and deposited directly onto the channel region 2 of the nanostructure. In particular, in the embodiments illustrated in FIG. 2A to 2D the gate dielectric 10 covers the channel region 2 completely, potentially with a small overlap of source region 1 and drain region 3. In particular, in accordance with embodiments of the present disclosure, the gate dielectric 10 has a varying physical thickness $t_{gd}$ along the channel 2 of nanostructure such that the gate-dielectric thickness (in the embodiments illustrated in FIG. 2A to FIG. 2D both the effective gate dielectric thickness $t_{gd,eff}$ and the physical gate dielectric thickness $t_{gd}$) is smaller at the source-channel interface 12 than above the channel 2 at a distance from the source-channel interface 12.

Onto the gate dielectric 10, a gate contact 9 (electrode) is deposited, step 114. The gate contact 9 is deposited on top of the gate dielectric 10, and for example may cover the whole gate dielectric but does not extend beyond the gate dielectric.

According to embodiments of the disclosure the gate dielectric 10 may for example be selected from at least one of silicon based oxide (e.g. silicon dioxide, silicon oxy nitride), aluminium oxide, high-k oxides (oxides, nitrided oxides), silicates or low-k dielectric materials. In particular embodiment the gate dielectric is a gate dielectric selected from silicon based oxide (e.g. silicon dioxide, silicon oxy nitride) having a relative dielectric constant of 3.9, or selected from state-of-the-art high-k dielectric materials with a dielectric constant higher than 3.9.

The embodiments illustrated in FIG. 2A and FIG. 2B show TFET devices according to embodiments of the present disclosure wherein the gate dielectric 10 has an abrupt change in physical thickness. This abrupt change in physical thickness takes place above the channel 2 region, at a pre-determined distance from the source-channel interface 12. In these embodiments, the gate dielectric 10 has a first section with a first constant thickness over a first length, covering at least the source-channel interface 12, which first thickness is smaller than a second constant thickness of a second section of the gate dielectric 10 above the channel 2 at a pre-determined distance from the source-channel interface 12.

According to embodiments as illustrated in FIGS. 2C and 2D the gate dielectric is having a first section of first length with constant thickness and a second section with second length with varying thickness. The first section with constant thickness is for example from 0 nm beyond source-channel interface (=varying immediately where the channel 2 region starts) up to 30 nm beyond source-channel interface, for example the first section with constant thickness is from 0 nm beyond source-channel interface up to 10 nm. The second section with second length with thickness increase (if present) may for example have thickness changes from 0.05 nm up to 50 nm, for example the second section with thickness increase may have changes from 0.1 nm up to 10 nm. The change in gate dielectric 10 thickness may be abrupt (as shown in FIGS. 2A and 2B) or gradual (as shown in FIGS. 2C and 2D).

The gate contact 9 may be made of a conductive material, for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular the gate contact may be made of a metal of which the workfunction has been engineered specifically for the chosen nanostructure material, the gate dielectric material and gate dielectric thickness.

Finally, in step 115, an electrical contact is formed on the source region 1 (situated on top of the nanostructure). The electrical contact is for example made of a conductive material which is selected from at least one of a silicide containing structure (NiSi, $CoSi_2$, $TiSi_2$, or the like), a germanide containing structure, a metal containing structure, poly silicon or a combination thereof. In particular embodiments the electrical contact may be a combination of a metal with a silicide.

In case the nanostructure is not doped during the growth process, an extra doping step may be advantageous. For example, implantation of dopant elements followed by activation of the dopant elements by e.g. annealing can be applied to achieve n-type or p-type region in the nanostructure. Alternatively, a layer, which is also referred to as dopant layer and which comprises dopant elements can be deposited or a dopant metal can be selectively deposited, e.g. with electro-chemical deposition, onto the nanostructure regions to be doped (not shown). An anneal step may then be applied so as to incorporate the dopant into the nanostructure region, resulting in an n-type or p-type region.

Example 2

Figure 6:
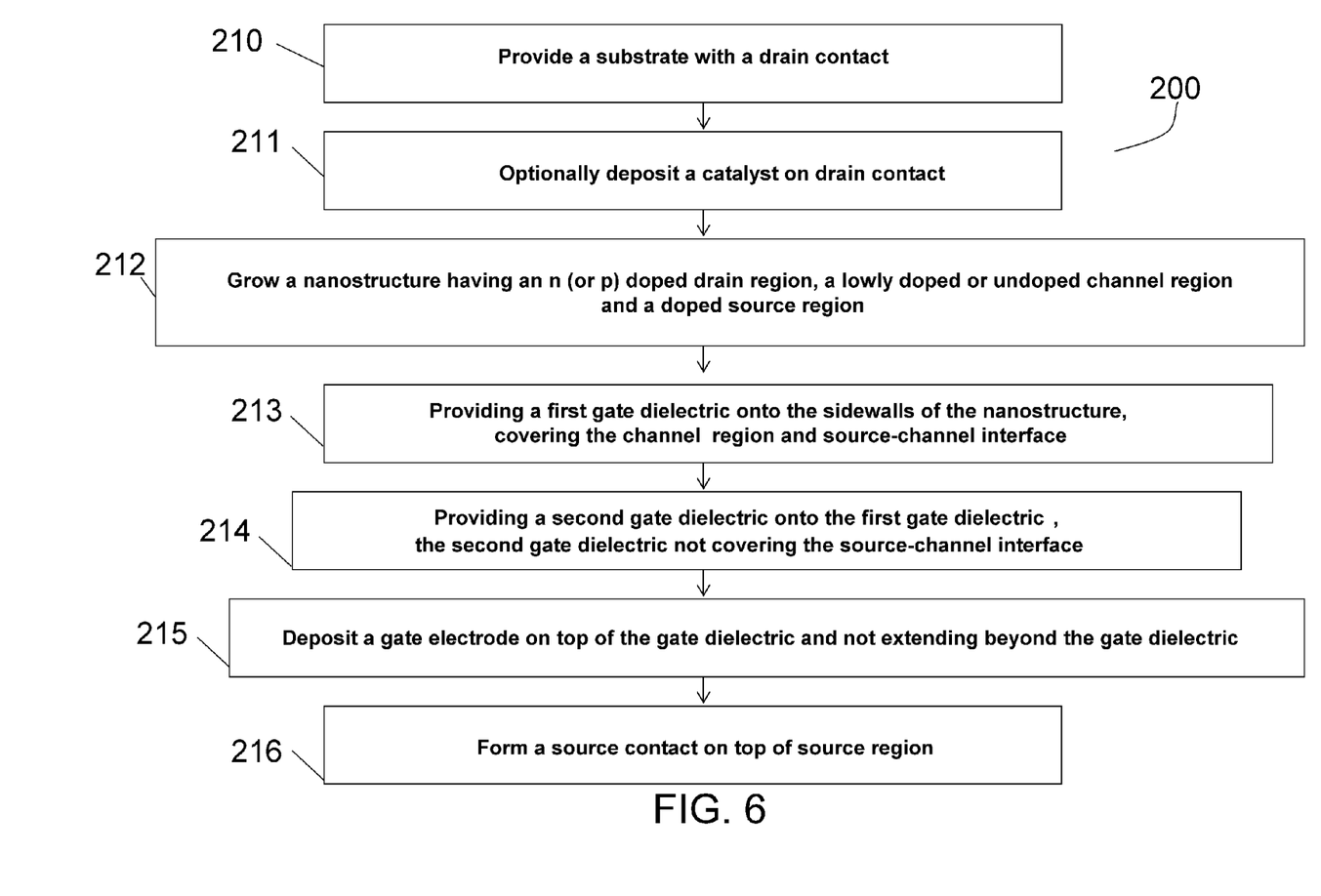
FIG. 6 illustrates an example of a flow diagram for fabricating a TFET (e.g. NW-TFET) according to embodiments of the present disclosure thereby making use of two gate dielectric materials.

A Processing Method and Related Flow Diagram for Fabricating a TFET with a Varying Effective Gate-Dielectric Thickness $t_{gd,eff}$ Making Use of Two Different Gate Dielectric Materials FIG. 6 illustrates a flow diagram 200 of an alternative method for fabricating a FTET (e.g. NW-TFET) of embodiments of the present disclosure thereby making use of two gate dielectric materials. Steps 210, 211 and 212 are similar to the steps 110, 111 and 112 described in example 1 with reference to FIG. 5. In step 213 and 214, a gate dielectric 10 is provided onto the sidewalls of the nanostructure, the gate dielectric 10 covering at 13 least the source-channel interface 12 and part of the channel region 2. In this embodiment, the gate dielectric 10 comprises at least a first dielectric layer 13 and a second dielectric layer 11. In step 213 the first gate dielectric 10 is provided onto the sidewalls of the nanostructure covering at least part of the channel region and the source-channel interface and then in a next step 214 a second gate dielectric 11 is provided onto the first gate dielectric 13 whereby the second gate dielectric does not cover the source-channel interface. This way, the gate dielectric 10 formed by a combination of the first gate dielectric 13 and the second gate dielectric 11 has a physical gate dielectric thickness which is smaller at the source-channel interface 12 than above the channel 2 at a pre-determined distance from the source-channel interface 12.

Steps 215 and 216 of the flow diagram 200 are similar to steps 114 and 115 described in example 1 with reference to FIG. 5.

A nanostructure formed in accordance with the flow chart of FIG. 6 is illustrated in FIG. 3A.

Figure 7:
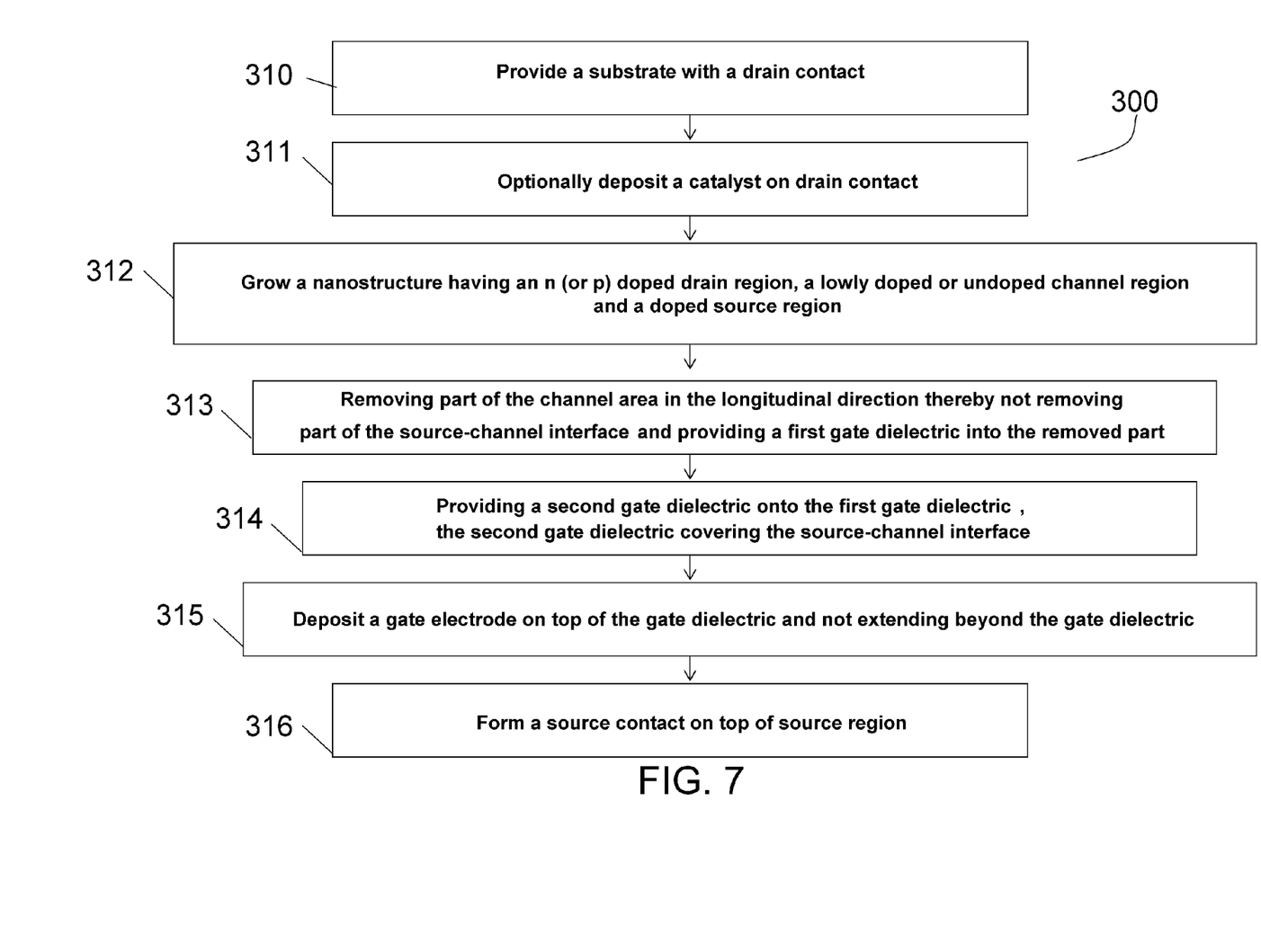
FIG. 7 illustrates an alternative example of a flow diagram for fabricating a TFET (e.g. NW-TFET) according to embodiments of the present disclosure thereby making use of two gate dielectric materials.

FIG. 7 illustrates a flow diagram 300 of an alternative method for fabricating a TFET (e.g. NW-TFET) of embodiments of the present disclosure thereby making use of two gate dielectric materials. Steps 310, 311 and 312 are similar to the steps 110, 111 and 112 described in example 1. In step 313 part of the channel 2 region in the longitudinal direction is removed thereby not removing parts of the source-channel interface 12 and a first gate dielectric 11 is provided into the removed part. As an example, providing a first gate dielectric 11 into the removed part of the channel region 2 also additionally includes a planarization step to planarize the surface of the first gate dielectric 11 such that it equals the outer surface of the nanostructure. Thereafter, in a next step 314, a second gate dielectric 13 is provided onto the first gate dielectric 11 such that the second gate dielectric 13 covers at least the source-channel interface 12 and part of the channel 2 region. This way, the gate dielectric 10 formed by a combination of the first gate dielectric 11 and the second gate dielectric 13 has a physical gate dielectric thickness which is smaller at the source-channel interface 12 than above the channel 2 at a pre-determined distance from the source-channel interface 12.

Steps 315 and 316 of the flow diagram 300 are similar to steps 114 and 115 described in example 1 with reference to FIG. 5. A nanostructure formed in accordance with the flow chart of FIG. 7 is illustrated in FIG. 3B.

Example 3

Device Simulations

Figure 4A:
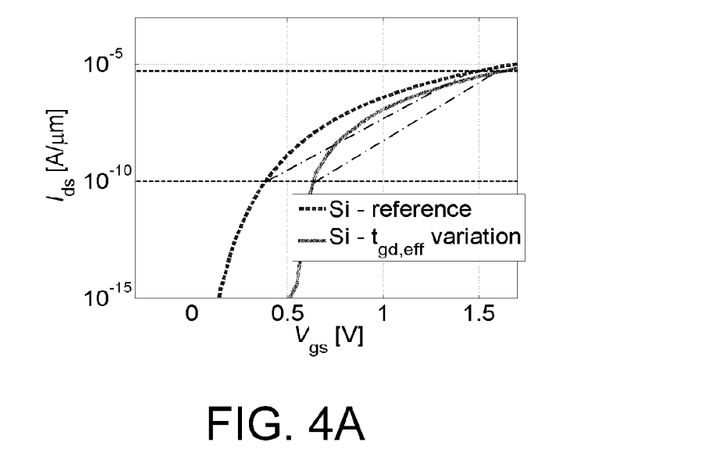
FIG. 4A illustrates simulations of an all-Si TFET with both a constant and an abruptly varying effective gate-dielectric thickness.
Figure 4B:
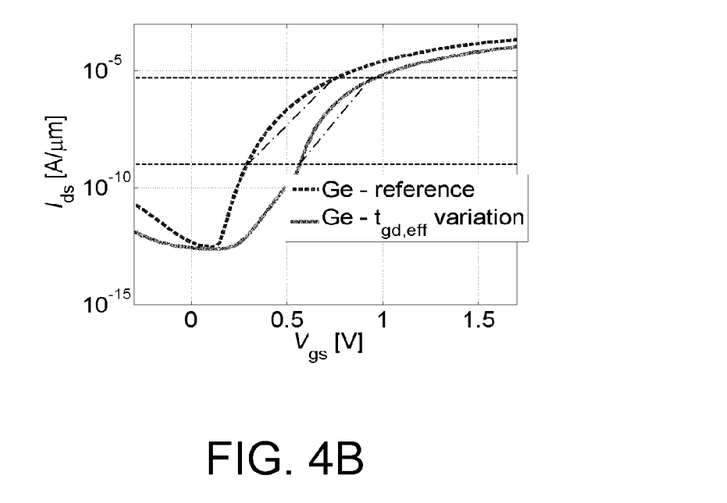
FIG. 4B illustrates simulations of an all-Ge TFET with both a constant and an abruptly varying effective gate-dielectric thickness. The average subthreshold swing (starting at the current of the bottom dashed line and ending at the current of the top dashed line) is steeper for the TFETs with increasing effective gate-dielectric thickness.

FIG. 4A and FIG. 4B illustrate device simulations (Medici, Synopsys, version 2008.09). FIG. 4A illustrates simulations of an all-Si TFET with both a constant (dotted line) and an abruptly varying effective gate-dielectric thickness (solid line). FIG. 4B illustrates simulations of an all-Ge TFET with both a constant (dotted line) and an abruptly varying effective gate-dielectric thickness (solid line). The average subthreshold slope (illustrated by a dot-dashed line starting at the current of the bottom dashed line and ending at the current of the top dashed line) is steeper for the TFETs with increasing effective gate-dielectric thickness according to embodiments of the present disclosure. The steeper subthreshold slope results in the possibility to reduce the supply voltage, and therefore results in a lower power device.

It is to be understood that although particular embodiments, specific constructions and configurations, as well as materials, have been discussed herein for devices according to embodiments of the present disclosure, various changes or modifications in form and detail may be made without departing from the scope of this disclosure as defined by the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

What is claimed is:

1. A tunnel field effect transistor, comprising:
a highly doped drain region;
a lowly doped or undoped channel region having a longitudinal direction and being in contact with the drain region;
a highly doped source region in contact with the channel region at a source-channel interface; and
a gate dielectric and a gate electrode covering, along the longitudinal direction, at least part of the source region and the channel region, the gate electrode being situated on the gate dielectric, but not extending beyond the gate dielectric, wherein an effective gate dielectric thickness is smaller at the source-channel interface than above the channel region at a distance from the source-channel interface, at least in part due to a difference in a physical thickness of the gate dielectric.

2. The tunnel field effect transistor of claim 1, wherein the physical thickness of the gate dielectric along the longitudinal direction increases as the distance from the source-channel interface increases.

3. The tunnel field effect transistor of claim 1, wherein an increase in the effective gate dielectric thickness along the channel region is abrupt.

4. The tunnel field effect transistor of claim 1, wherein an increase in the effective gate dielectric thickness along the channel region is gradual.

5. The tunnel field effect transistor of claim 1, wherein an increase in the effective gate dielectric thickness along the channel region is a combination of both abrupt and gradual.

6. The tunnel field effect transistor of claim 1, wherein an increase in the effective gate dielectric thickness is achieved by providing at least two gate dielectric materials one on top of the other, each having a different dielectric constant, and wherein at least one of the gate dielectric materials has an altering thickness along the channel region.

7. The tunnel field effect transistor of claim 1, wherein an increase in effective gate dielectric thickness along the channel region is achieved in combination with a variation in a physical thickness of the channel region.

8. The tunnel field effect transistor of claim 1, wherein the increase in effective gate dielectric thickness along the channel region is achieved by decreasing the physical thickness of the gate dielectric while decreasing a gate dielectric constant.

9. The tunnel field effect transistor of claim 1, wherein the increase in effective gate-dielectric thickness is achieved by the gate dielectric having a first section with a constant first thickness over a first length and a second section with a second thickness over a second length, the second thickness being larger than the first thickness.

10. The tunnel field effect transistor of claim 1, wherein the first section covers a length of from 0 nm to 20 nm beyond the source-channel interface.

11. The tunnel field effect transistor of claim 10, wherein the second thickness is from 0.05 nm to 50 nm greater than the first thickness.

12. The tunnel field effect transistor of claim 1, which is a segmented nanostructure tunnel field effect transistor, wherein different segments of the tunnel field effect transistor comprise the source region, the channel region and the drain region of the tunnel field effect transistor.

13. The tunnel field effect transistor of claim 1, wherein the gate dielectric is selected from silicon based oxide (e.g. silicon dioxide, silicon oxy nitride), state-of-the-art high-k dielectric materials and/or low-k dielectric materials.

14. The tunnel field effect transistor of claim 1, further comprising a source contact and a drain contact.

* * * * *